United States Patent [19]

Ito et al.

[11] Patent Number: 4,747,019

[45] Date of Patent: May 24, 1988

[54] FEEDTHROUGH CAPACITOR ARRANGEMENT

[75] Inventors: Katsuo Ito, Kanazawa; Bunjiro Murata, Komatsu; Yoji Maeda, Matto; Masao Uno, Komatsu; Kazunori Kinoshita; Kazuhiro Tsuji, both of Kanazawa, all of Japan

[73] Assignee: Murata Manufacturing Co., Ltd., Japan

[21] Appl. No.: 806,670

[22] Filed: Dec. 9, 1985

[30] Foreign Application Priority Data

Dec. 14, 1984 [JP] Japan .................................. 59-265045
Sep. 2, 1985 [JP] Japan ............................ 60-134319[U]

[51] Int. Cl.⁴ ............................................. H05K 9/00
[52] U.S. Cl. ....................................... 361/424; 29/840; 174/35 R
[58] Field of Search ............. 174/35 R; 361/422, 424; 29/832, 840

[56] References Cited

U.S. PATENT DOCUMENTS

| | | | |
|---|---|---|---|
| 3,524,137 | 8/1970 | Redfield et al. ..................... | 361/424 |
| 3,816,911 | 6/1974 | Knappenberger ................... | 361/424 |
| 4,306,205 | 12/1981 | Ito et al. ................................ | 334/85 |
| 4,370,700 | 1/1983 | Duddles et al. ..................... | 361/424 |
| 4,404,617 | 9/1983 | Ohyama et al. .................. | 174/35 R |

FOREIGN PATENT DOCUMENTS 2101811 1/1983 United Kingdom ............. 174/35 R

Primary Examiner—A. D. Pellinen
Assistant Examiner—Gregory D. Thompson
Attorney, Agent, or Firm—Ostrolenk, Faber, Gerb & Soffen

[57] ABSTRACT

A feedthrough capacitor arrangement which comprises a frame having a first recess, printed circuit boards disposed in the vicinity of the frame, a feedthrough capacitor having an outer electrode and a central electrode placed in the first recess and a shield member for pressing the feedthrough capacitor placed in the first recess thereby to hold the feedthrough capacitor in association with the frame. In this arrangement, the outer electrode of the feedthrough capacitor is soldered to the frame and to the shield member while the central electrode is soldered to conductor patterns on the printed circuit boards.

12 Claims, 11 Drawing Sheets

FIG. 3A
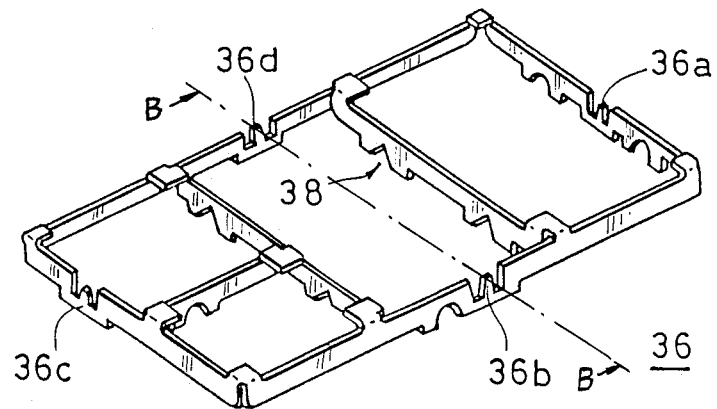
FIG. 3B
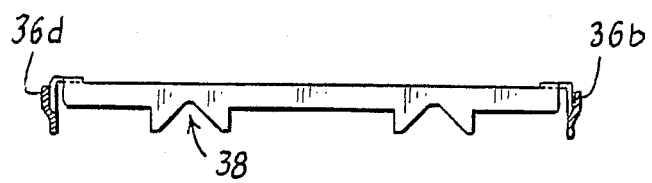
FIG. 3D
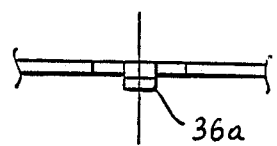
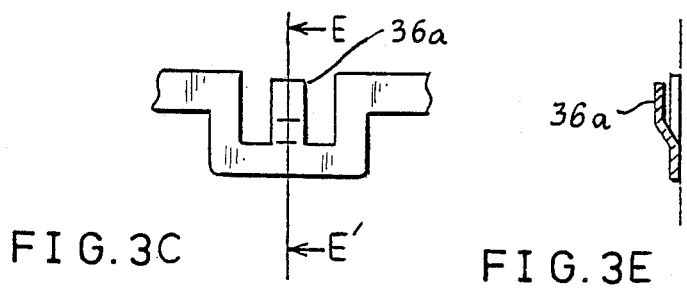
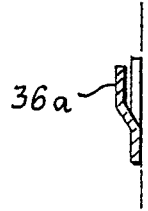
FIG. 3C         FIG. 3E

FEEDTHROUGH CAPACITOR ARRANGEMENT

BACKGROUND OF THE INVENTION

1. Field of the Invention

The present invention relates to a feedthrough capacitor arrangement, and more particularly to a feedthrough capacitor arrangement for use in a high frequency apparatus such as an electronic tuner for a television receiver, particularly a CATV converter.

2. Description of the Prior Art

FIG. 16 is a sectional view showing a mounting arrangement for a conventional feedthrough capacitor which is in the background of the present invention. A shield frame 10 is provided with a round hole 12 with printed circuit boards 14 and 16 disposed in the vicinity thereof. A feedthrough capacitor 18 is inserted in the round hole 12 of the shield frame 10, and its outer electrode 20 is soldered to the shield frame 10 and both ends 22a and 22b of its central electrode 22 are soldered to the printed circuit boards 14 and 16 respectively.

Two methods are employable for mounting such a feedthrough capacitor 18.

In a first method, the feedthrough capacitor 18 is inserted in the round hole 12 of the shield frame 10 as shown in FIG. 17 and fitted with a solder ring 24 as shown in FIG. 18. Then, heat is applied from, e.g., an oven, to effect soldering as shown in FIG. 19. Then the printed circuit boards 14 and 16 are assembled in the shield frame 10 and then the central electrode of the feedthrough capacitor 18 is soldered to conductor patterns on the printed circuit boards 14 and 16 respectively.

In a second method, the frame 10 and the printed circuit boards 14 and 16 are assembled and then the feedthrough capacitor 18 is inserted in the round hole 12 of the frame 10 as shown in FIGS. 20 and 21. Thereafter the outer electrode 20 is soldered to the shield frame 10, and both ends 22a and 22b of the central electrode 22 of the feedthrough capacitor 18 are soldered to the printed circuit boards 14 and 16 respectively by solder dipping.

In the aforementioned first method, the feedthrough capacitor 18 is first soldered to the frame 10 and then to the printed circuit boards 14 and 16 by separate steps. If another feedthrough capacitor is to be employed in a different direction, further, the same cannot be assembled with the aforementioned feedthrough capacitor 18. In the first method, thus, mounting of the feedthrough capacitor 18 is complicated.

On the other hand, the second method is inferior in fitting workability since the available space around the round hole 12 is restricted by the printed circuit boards 14 and 16 which are assembled in a structure which includes the shield frame 10 before insertion of the feedthrough capacitor 18. Further, the feedthrough capacitor 18 may be displaced from the shield frame 10 by loosening of the solder in the subsequent solder dipping steps, whereby soldering correction is required in a later step. Thus, the second method is inferior in workability.

SUMMARY OF THE INVENTION

Accordingly, an object of the present invention is to provide a high frequency apparatus to which a feedthrough capacitor can be easily mounted.

The present invention provides a high frequency apparatus which comprises a frame, printed circuit boards disposed in the vicinity of the frame, a first recess formed in the frame, a feedthrough capacitor placed in the first recess and a shield member for pressing, holding, clamping, or gripping the feedthrough capacitor to hold the same in association with the frame. An outer electrode of the feedthrough capacitor is soldered to the frame and to the shield member, and a central electrode thereof is soldered to conductor patterns of the printed circuit boards.

The feedthrough capacitor is fitted in the first recess which is formed in the frame, to be held by the frame and the shield member. The outer electrode of the feedthrough capacitor is fixed by connection to the frame and the central electrode thereof is fixed by connection to the conductor patterns of the printed circuit boards.

According to the present invention, the feedthrough capacitor need not be passed through the round hole as in the conventional case but is simply placed in the recess of the frame, whereby the feedthrough capacitor is readily mounted to the frame. Further, the feedthrough capacitor is held in a fixed position by the frame and the shield member, which makes it possible to assemble the capacitor to the frame and to the printed circuit boards by one dipping operation, whereby a soldering step is simplified.

These and other objects, features, aspects and advantages of the present invention will become more apparent from the following detailed description of embodiments of the present invention when taken in conjunction with the accompanying drawings.

BRIEF DESCRIPTION OF THE DRAWINGS

FIG. 3A is a perspective view showing a shield member employed in the embodiment shown in FIG. 1;

FIG. 3B is a section taken along line B—B' of FIG. 3A;

FIG. 3C is a side view of a portion of FIG. 3A;

FIG. 3D is a plan view corresponding to FIG. 3C;

FIG. 3E is a section along line E—E' of FIG. 3C;

FIGS. 5 to 7 illustrate steps of mounting the feedthrough capacitor in the embodiment shown in FIG. 1, wherein FIG. 5 is a sectional view showing the feedthrough capacitor fitted in a recess portion, FIG. 6 is a sectional view showing the feedthrough capacitor held by the frame and the shield member, and FIG. 7 is a sectional view showing the feedthrough capacitor soldered to the frame, the shield member, and the circuit boards;

FIGS. 17 to 19 illustrate a series of conventional steps of mounting a feedthrough capacitor, wherein FIG. 17 is a perspective view showing a feedthrough capacitor before insertion of the feedthrough capacitor in a round hole, FIG. 18 is a sectional view showing the feedthrough capacitor inserted in the round hole, and FIG. 19 is a sectional view showing the feedthrough capacitor fixed by soldering to a frame; and FIGS. 20 and 21 illustrate another series of conventional steps of mounting a feedthrough capacitor, wherein FIG. 20 is a sectional view showing a feedthrough capacitor before insertion of the feedthrough capacitor in a round hole, and FIG. 21 is a sectional view showing the feedthrough capacitor inserted in the round hole.

DESCRIPTION OF THE PREFERRED EMBODIMENTS

Figure 1:
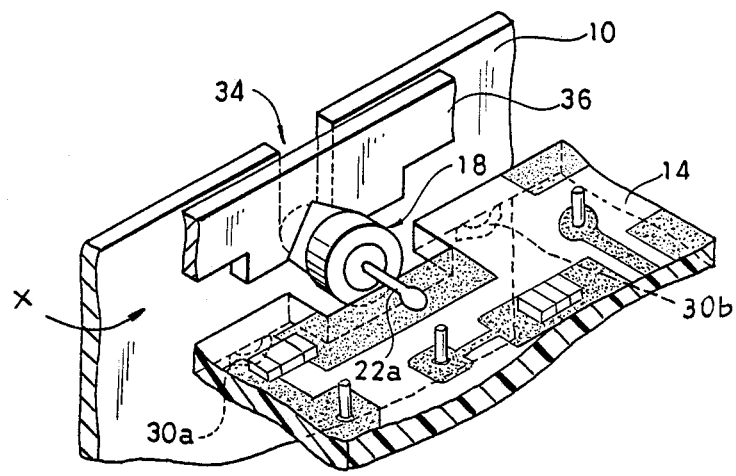
FIG. 1 is a perspective view showing a detail of a feedthrough capacitor arrangement in a high frequency apparatus according to an embodiment of the present invention.
Figure 2:
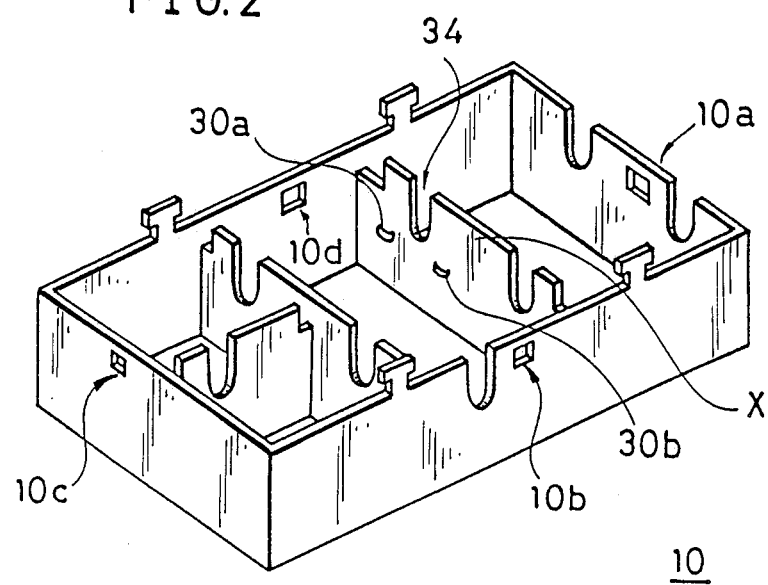
FIG. 2 is a perspective view showing a frame employed in the embodiment shown in FIG. 1.

FIG. 1 is a perspective view showing a detail of an embodiment of the present invention. FIG. 1 partially shows a frame portion X of a frame 10 which is assembled in the form of a lattice as particularly shown in FIG. 2. As shown in FIGS. 1 and 2, the frame portion X is provided on one of its major surfaces with projections 30a and 30b at a prescribed interval, for engaging a printed circuit board 14 which is provided with necessary components (see FIG. 1). The frame 10 is further provided on its other major surface with projections 32a and 32b (see FIG. 4) substantially corresponding to the projections 30a and 30b, for engaging a printed circuit board 16 in a similar manner to the above.

The term "frame" herein used indicates the entire structure 10 as shown in FIG. 2, including the frame portion X which is generally called a partition plate.

A U-shaped first recess 34 is defined between the projections 30a and 30b of the frame 10 in constant depth from its upper end at an upper edge E. Preferably the width of the first recess 34 is substantially equal to or slightly larger than the outer diameter of a feedthrough capacitor 18 as hereinafter described. The feedthrough capacitor 18 is fitted in the first recess 34 toward an inner portion P, in the direction as shown by arrows 35a in FIG. 4. This state is shown in FIG. 5.

Then, a rear shield, i.e., a shield member 36 as shown in FIGS. 3A–3E is inserted in the frame 10. In this case, as projections 36a, 36b, 36c and 36d formed in the side portions of the shield member 36 have resiliency and outwardly project, they are snapped into slots 10a, 10b, 10c and 10d provided on the side walls of the frame 10 respectively, to prevent displacement of the shield member 36.

Figure 4:
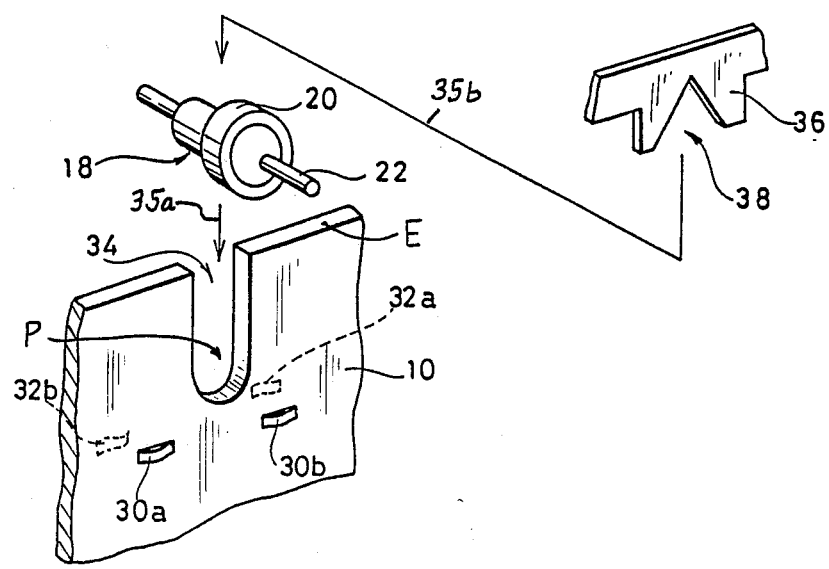
FIG. 4 is a perspective view illustrating a step of mounting a feedthrough capacitor and the shield member in the embodiment shown in FIG. 1.
Figure 5:
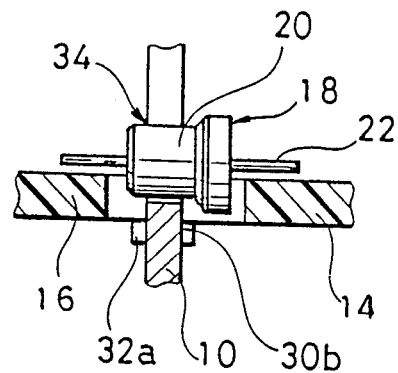
Figure 6:
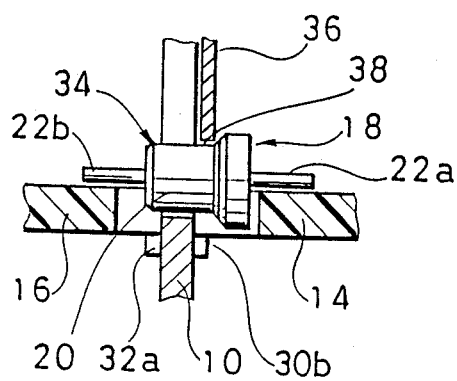

A V-shaped second recess 38 is provided in the lower end of the shield member 36 so that the shield portion around the V-shaped second recess 38 comes into contact with the upper part of an outer electrode 20 of the feedthrough capacitor 18, to press and secure the same from above as indicated by arrow 35b in FIG. 4, thus inhibiting upward movement of the capacitor 18. Thus, the feedthrough capacitor 18 is held by the shield member 36 and the frame 10. In this state, an end 22a of a central electrode 22 of the feedthrough capacitor 18 is located on the conductor pattern of the printed circuit board 14 while the other end 22b thereof is located on the conductor pattern of the other printed circuit board 16.

As hereinabove described, the projections 36a to 36d of the shield member 36 are engaged in the slots 10a to 10d of the frame 10 to prevent the shield member 36 from displacement while pressing the feedthrough capacitor 18 and thereby the printed circuit boards 14 and 16 as well. Thus, the feedthrough capacitor 18 and the printed circuit boards 14 and 16 are temporarily fixed to the frame 10.

Figure 7:
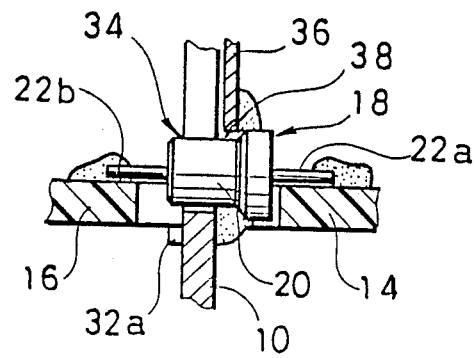

Thereafter solder dipping is performed. Thus, as shown in FIG. 7, the outer electrode 20 of the feedthrough capacitor 18 is soldered to the first and second recesses 34 and 38. Further, the ends 22a and 22b of the central electrode 22 of the feedthrough capacitor 18 are soldered to the conductor patterns of the printed circuit boards 14 and 16 respectively.

Figure 8A:
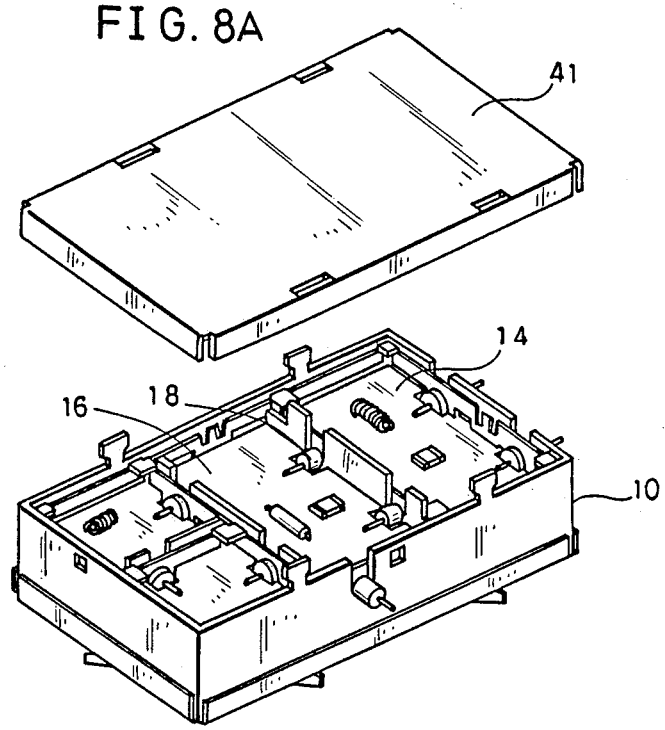
FIG. 8A is an exploded perspective view illustrating a high frequency apparatus including a feedthrough capacitor arrangement according to the embodiment shown in FIG. 1.
Figure 8B:
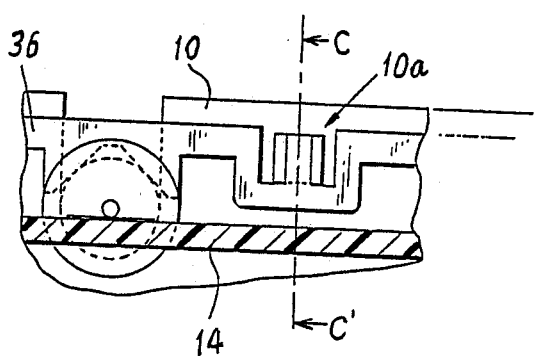
FIG. 8B is an elevational view of a portion of FIG. 8A.
Figure 8C:
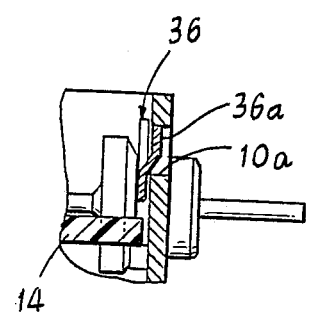
FIG. 8C is a section along line C—C' of FIG. 8B.

Thus, the printed circuit boards 14 and 16, the feedthrough capacitor 18 and the like are assembled with the frame 10, which is then integrally connected with the shield member 36, to be covered by a lid member 41 as shown in FIGS. 8A–8C. Thus, an assembly, for example an electronic tuner, according to this embodiment is obtained.

Figure 9:
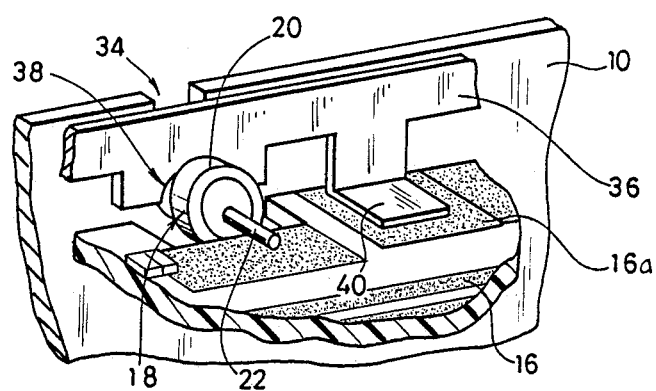
FIG. 9 is a perspective view showing a detail of another embodiment of the present invention.

FIG. 9 is a perspective view showing another embodiment of the present invention. In this embodiment, a shield member 36 is particularly provided with a connecting member 40. The connecting member 40 downwardly extends from the lower part of the shield member 36, and is bent to be located on a ground pattern 16a of a printed circuit board 16. The connecting member 40 is soldered to the ground pattern 16a. Thus, the connecting member 40 is adapted to connect the ground side of the printed circuit board 16 to the shield member 36, thereby to ensure soldering of the ground pattern 16a by one dipping operation.

Figure 10:
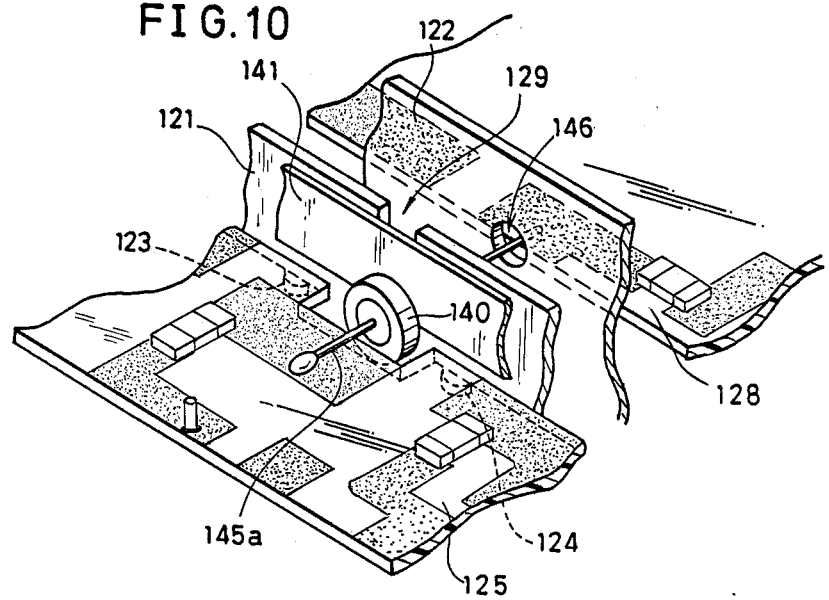
FIG. 10 is a perspective view showing a detail of still another embodiment of the present invention.
Figure 11:
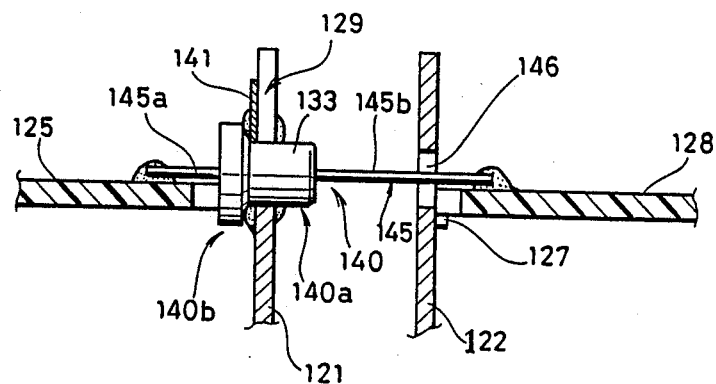
FIG. 11 is a sectional view corrsponding to FIG. 10.

FIGS. 10 to 15 illustrate still another embodiment of the present invention. As shown in FIGS. 10 and 11, a pair of metal plates 121 and 122 are provided with respective corresponding portions for receiving a feedthrough capacitor.

Figure 12:
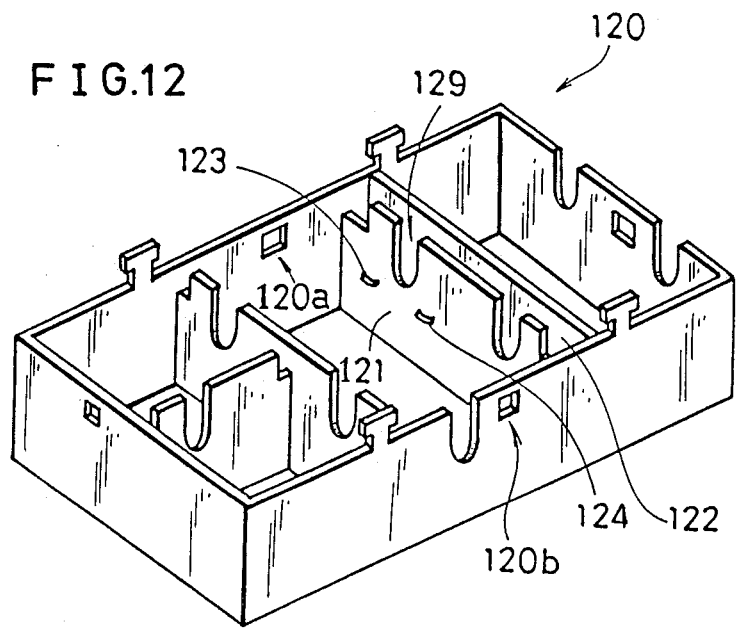
FIG. 12 is a perspective view showing a frame employed in the embodiment shown in FIGS. 10 and 11.

More particularly, a first metal plate 121 and a second metal plate 122 are provided with a prescribed interval therebetween. The respective metal plates 121 and 122 partially form a frame 120 as shown in FIG. 12. As shown in FIGS. 10 and 12, the first metal plate 121 is formed with projections 123 and 124 on an outer side thereof, for engaging a first printed circuit board 125 packaged with necessary components. The term "outer side" herein indicates the outer side away from the interval between the first and second metal plates 121 and 122.

As shown in FIG. 11, the second metal plate 122 is also provided on its outer surface with a projection 127, to be assembled with a second printed circuit board 128.

Figure 14:
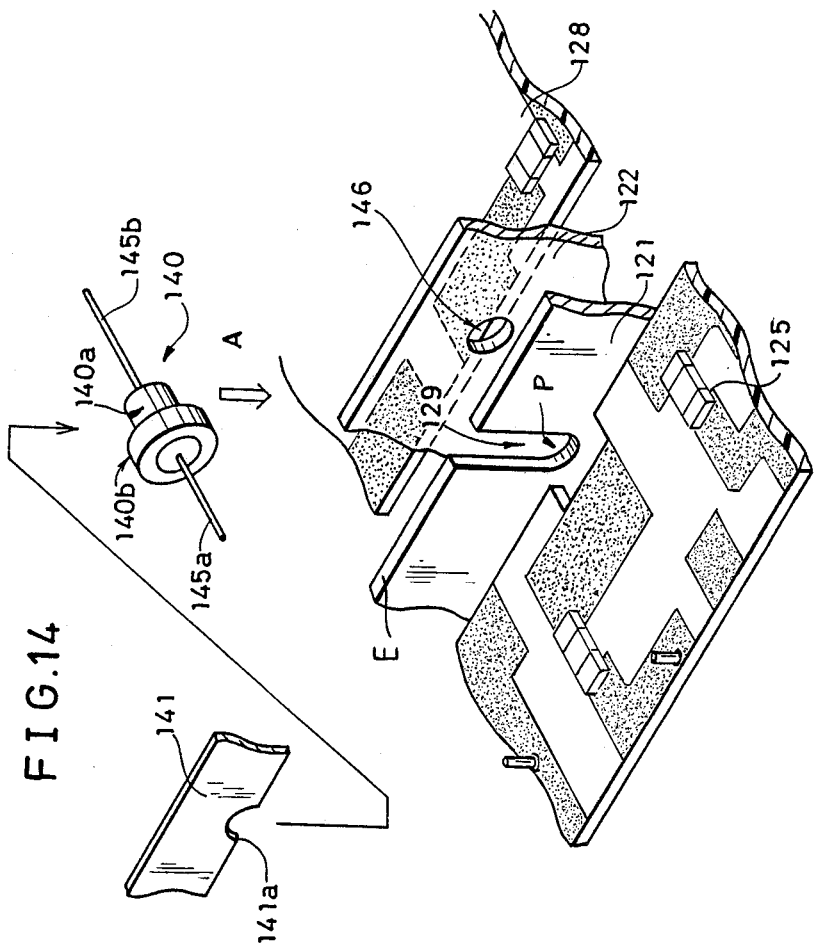
FIG. 14 is a perspective view illustrating steps of assembling the embodiment shown in FIGS. 10 and 11.

As shown in FIG. 12, the first metal plate 121 is further provided with a first recess 129 opening at its upper edge E (see also FIG. 14). Preferably the width of the first recess 129 is substantially equal to or slightly larger than the outer diameter of a body of a feedthrough capacitor 140 as hereinafter described.

Figure 15:
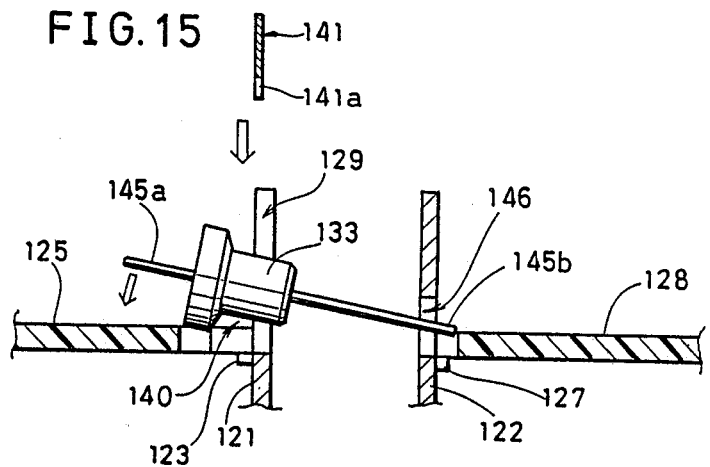
FIG. 15 is a sectional view corresponding to FIG. 14 illustrating a step of inserting a feedthrough capacitor in a first recess portion.
Figure 16:
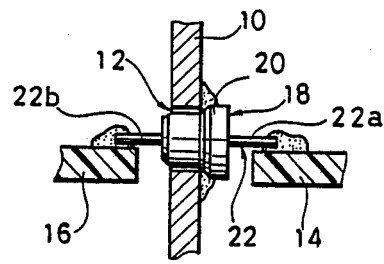
FIG. 16 is a sectional view showing a mounting arrangement for a conventional feedthrough capacitor which is in the background of the present invention.
Figure 17:
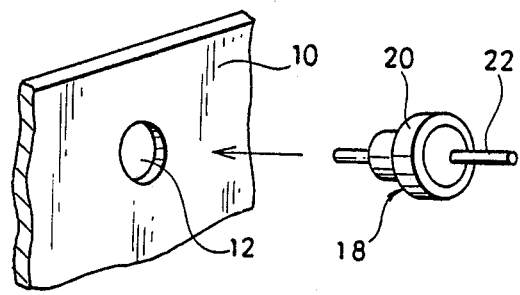
Figure 18:
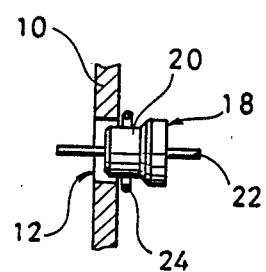
Figure 19:
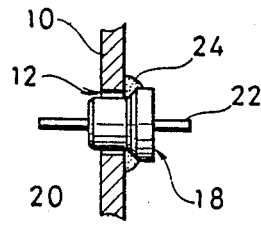
Figure 20:
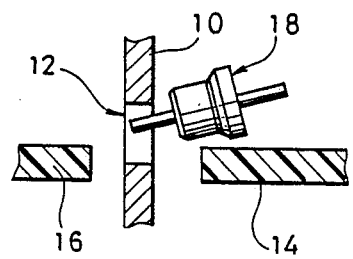
Figure 21:
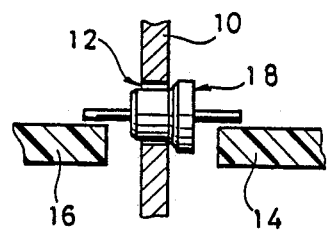

The second metal plate 122 is provided with a hole 146 which is opposite to the first recess 129, as shown in FIG. 10. The feedthrough capacitor 140 is inserted in the first recess 129 toward an inner portion P in the direction A as shown in FIG. 14 to be fitted therein. FIG. 15 shows this step in section.

As shown in FIG. 15, a shield member 141 is mounted from above to hold the feedthrough capacitor 140. This shield member 141 is integrally formed in a shield member 143 as shown in perspective view in FIG. 13. The shield member 143 is fixed to the frame 120 as shown in FIG. 12, whereby the shield member 141 is fixed to the frame 120.

Figure 13:
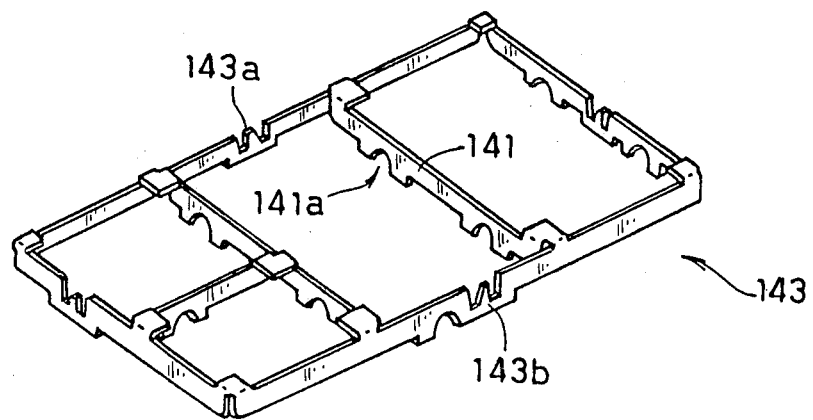
FIG. 13 is a perspective view showing a shield member to be employed in the embodiment shown in FIG. 12.

As shown in FIG. 14, the shield member 141 is provided in its lower portion with a recess 141a. The recess 141a is adapted to be in contact with a small-diametrical portion 140a of the feedthrough capacitor 140, i.e., the portion to be fitted in the first recess 129. Projections 143a and 143b formed on the shield member 143 as shown in FIG. 13 are engaged with slots 120a and 120b formed in the frame 120 as shown in FIG. 12, whereby the shield member 143 is fixed to the frame 120. At the same time, the shield member 141 is inserted in the frame 120 along the outer surface of the first metal plate 121 to be fixed to the same by the fixing of the shield member 143 to the frame 120. Thus, the shield member 141 having the recess 141a is so formed that the recess 141a can be in contact with the small-diametrical portion 140a of the feedthrough capacitor 140 previously inserted in the frame 120, thereby to locate and hold the feedthrough capacitor 140 as shown in FIGS. 10 and 11.

After the shield member 141 is inserted, but before soldering is performed as in FIGS. 10 and 11, the small-diametrical portion 140a of the feedthrough capacitor 140 is temporarily fixed in the first recess 129 of the first metal plate 121 by the shield member 141. Therefore, an outer electrode 133 provided on the outer surface of the portion 140a of the feedthrough capacitor 140 is brought in contact with the first metal plate 121 and the shield member 141. The central electrode 145 of the feedthrough capacitor 140, has a central electrode portion 145a which passes through the first metal plate 121 and extends toward the first printed circuit board 125. Similarly, a central electrode portion 145b which is passed through the second metal plate 122 extends onto the second printed circuit board 128 through the hole 146 formed in the second metal plate 122. As hereinabove described, the feedthrough capacitor 140 is temporarily fixed at this time. Hence the central electrode portion 145b extends in an appropriate direction not to be in contact with the inner peripheral surface of the hole 146, to correctly extend onto the conductor pattern of the second printed circuit board 128 to be connected therewith.

Then solder dipping is performed on the frame 120 thus assembled with the shield member 141, so that the outer electrode 133 of the feedthrough capacitor 140 is soldered to the shield member 141 and the first metal plate 121. At the same time, the portion 145a of the central electrode 145 extending beyond the first metal plate 121 is soldered to the conductor pattern on the first printed circuit board 125 while the portion 145b extending beyond the second metal plate 122 is soldered to the conductor pattern on the second printed circuit board 128.

Thus, assembled is the structure of the embodiment as shown in FIGS. 10 and 11.

Although the second metal plate 122 is formed with the hole 146 which is opposite to the first recess 129 in the aforementioned embodiment, this hole 146 may be replaced by an upwardly opening recess which is opposite to the first recess 129. In this case, the feedthrough capacitor 140 can be more readily inserted between the first and second metal plates 121 and 122. Needless to say, the feedthrough capacitor 140 can be temporarily fixed to the first recess 129 in an appropriate way by the shield member 141 also in the case where the hole 146 is replaced by the recess.

Although embodiment of the present invention have been described and illustrated in detail, it is clearly understood that the same is by way of illustration and example only and is not to be taken by way of limitation, the spirit and scope of the present invention being limited only by the terms of the appended claims.

What is claimed is:

1. A feedthrough capacitor arrangement comprising:
   a frame having a first recess extending from an edge of said frame, to an inner portion spaced away from said edge of said frame;
   at least one printed circuit board placed adjacent to said frame substantially in a plane near said inner portion of said first recess;
   a feedthrough capacitor placed in said first recess, said feedthrough capacitor including an outer electrode and a central electrode; and
   a shield member pressing said feedthrough capacitor placed in said first recess in association with said frame,
   said outer electrode of said feedthrough capacitor being soldered to said frame and said shield member, and said central electrode of said feedthrough capacitor being soldered to a conductor pattern on said printed circuit board.

2. A feedthrough capacitor arrangement in accordance with claim 1, wherein
   said first recess is so formed that it opens at an upper edge of said frame, and
   said printed circuit board is placed just below a lowest portion of said first recess, such that said central electrode of said feedthrough capacitor placed in said first recess, extends to adjacent one surface of said printed circuit board.

3. A feedthrough capacitor arrangement in accordance with claim 1, wherein said shield member is provided with a second recess corresponding to said first recess of said frame, said first and second recesses engaging respective portions of said capacitor.

4. A feedthrough capacitor arrangement in accordance with claim 2, wherein said shield member is a frame-shaped member configured for being inserted within said frame.

5. A feedthrough capacitor arrangement in accordance with claim 4, wherein at least one of said shield member and said frame is provided with projections and the other one is provided with openings for receiving said projections, and said shield member and said frame are fixed to each other by an engagement between said projections and openings.

6. A feedthrough capacitor arrangement in accordance with claim 1, wherein
   said frame has first and second metal plates placed opposite one another with a prescribed interval therebetween, said first metal plate being provided with said first recess and said second metal plate being provided with an opening opposite to said first recess;

first and second printed circuit boards are placed adjacent to said plates and extending away from said prescribed interval therebetween, substantially in planes near said inner portion of said first recess;

a body of said feedthrough capacitor is inserted in said first recess and said outer electrode is soldered to said first metal plate in the vicinity of said first recess, while a portion of said central electrode extending beyond said first metal plate away from said interval is soldered to said first printed circuit board, and a portion of said central electrode extending beyond said second metal plate away from said interval is soldered to said second printed circuit board through said opening in said second metal plate; and said shield member is provided to hold said feedthrough capacitor placed in said first recess in association with said first metal plate.

7. A feedthrough capacitor arrangement in accordance with claim 6, wherein said shield member is placed to restrict movement of said feedthrough capacitor away from said inner portion of said first recess toward said edge of said frame, and the shield member is fixed to said frame.

8. A feedthrough capacitor arrangement in accordance with claim 6, wherein said shield member is further provided with a second recess corresponding to said first recess of said frame, said first and second recesses engaging respective portions of said capacitor.

9. A feedthrough capacitor arrangement in accordance with claim 3, wherein said second recess is a V-shaped recess.

10. A feedthrough capacitor arrangement in accordance with claim 8, wherein said second recess is a V-shaped recess.

11. A high frequency apparatus comprising:

a frame having a first recess extending from an edge of said frame, to an inner portion spaced away from said edge of said frame;

at least one printed circuit board placed adjacent to said frame substantially in a plane near said inner portion of said first recess;

a feedthrough capacitor placed in said first recess, said feedthrough capacitor including an outer electrode and a central electrode;

a shield member pressing said feedthrough capacitor placed in said first recess in association with said frame, said outer electrode of said feedthrough capacitor being soldered to said frame and said shield member, and said central electrode of said feedthrough capacitor being soldered to a conductor pattern on said printed circuit board; and cover means for covering said frame, enclosing said printed circuit board, said feedthrough capacitor, and said shield member to provide a housing.

12. A feedthrough capacitor arrangement obtained through the steps of:

disposing at least one printed circuit board adjacent to a frame, said frame having a first recess extending from an edge of said frame, to an inner portion spaced away from said edge of said frame, and placing a feedthrough capacitor including an outer electrode and a central electrode in said first recess substantially in a plane near said inner portion of said first recess; and fixing a frame-shaped shield member to said frame to hold said feedthrough capacitor in said first recess;

performing solder dipping to simultaneously make respective electric connections among said feedthrough capacitor, said frame, said shield member and said printed circuit board.

* * * * *